United States Patent [19]

Bowman et al.

[11] Patent Number: 4,527,866

[45] Date of Patent: Jul. 9, 1985

[54] ACOUSTO-OPTIC TRANSDUCER

[75] Inventors: Roger Bowman, Hemel Hempstead; Robert C. Peach, Harrow; David R. J. Milverton, Berkhampstead, all of England

[73] Assignee: The Marconi Company, Limited, England

[21] Appl. No.: 480,394

[22] Filed: Mar. 30, 1983

[30] Foreign Application Priority Data

Apr. 1, 1982 [GB] United Kingdom ................ 8209660

[51] Int. Cl.³ .............................................. G02F 1/11
[52] U.S. Cl. ................................................. 350/358
[58] Field of Search ........................................ 350/358

[56] References Cited

U.S. PATENT DOCUMENTS 4,126,834 11/1978 Coppock ............................ 350/358

FOREIGN PATENT DOCUMENTS 1532250 11/1978 United Kingdom .
2014327 8/1979 United Kingdom .
2017954 10/1979 United Kingdom .

OTHER PUBLICATIONS

Yano et al., "Acoustooptic TeO$_2$ Tunable Filter Using Far-Off-Axis Anisotropic Bragg Diffraction", Applied Optics, vol. 15, No. 9, Sep. 1976, pp. 2250-2258.
Yano et al., "TeO$_2$ Anisotropic Bragg Light Deflector Without Midband Degeneracy", Applied Physics Letters, vol. 26, No. 12, Jun. 1975, pp. 689-691.

Primary Examiner—John K. Corbin
Assistant Examiner—Bruce S. Shapiro
Attorney, Agent, or Firm—Kirschstein, Kirschstein, Ottinger & Israel

[57] ABSTRACT

A spectrum analyzer incorporates a 36° Y cut lithium niobate Bragg cell provided on one face with an interdigital transducer. The 36° Y cut maximizes the ratio of quasi-longitudinal to quasi-shear wave piezoelectric coupling with the interdigital transducer and thereby minimizes the output of spurious signals from the analyzer. In a preferred embodiment the Bragg cell comprises two lithium niobate crystals bonded by a metal (preferably gold) film, the crystal attached to the transducer being 36° Y cut and the other crystal being cut so as to maximize acousto-optic coupling.

7 Claims, 6 Drawing Figures

ACOUSTO-OPTIC TRANSDUCER

This invention relates to bulk-wave acousto-optic devices and is particularly concerned with microwave spectrum analysers (such as those used in radar systems, for example) incorporating such devices.

Acousto-optic devices are known in which the microwave signal to be analysed is used to generate bulk or surface-propagated ultrasonic elastic waves (which will subsequently be referred to merely as acoustic waves) in piezoelectric material which are propagated across the path of a laser beam. The periodic alteration of refractive index within the piezoelectric material caused by the elastic waves causes Bragg deflection of the laser beam, which is split up into a multiplicity of beams whose intensity-deflection distribution corresponds to the spectrum of the microwave signal. Such acousto-optic devices are known as Bragg cells.

An object of the present invention is to provide a Bragg cell microwave spectrum analyser having a higher bandwidth than previously used devices.

A typical device in accordance with the invention has a centre frequency of 1 GHz and a 50% bandwidth.

A subsidiary object of the invention is to provide a microwave analyser of high piezoelectric efficiency and hence high sensitivity and or high signal-to-noise ratio.

According to the present invention a spectrum analyser incorporates a bulk wave Bragg cell provided on one face with an interdigital transducer, the crystal orientation of the Bragg cell being such that in use, substantially zero Bragg reflection occurs from quasi-shear waves in the crystal. Preferably said Bragg cell is substantially cuboidal and composed of lithium niobate cut in the 36° Y plane with the interdigital transducer fixed to a 36° Y cut face of the cell. We have found that such a construction maximizes the ratio of quasi-longitudinal:quasi-shear wave piezo-electric coupling of the interdigital transducer, and thereby minimizes the output of spurious optical signals in use of the analyser.

The use of an interdigital transducer in a Bragg cell has particular advantages, as is shown in detail below, since an interdigital transducer may be constructed so as to generate a beam of acoustic waves in the Bragg cell with a well defined divergence or "spread" so that Bragg reflection of the optical beam occurs over a wide range of Bragg angles. Since the Bragg angle varies linearly with acoustic frequency, such a construction results in a wide bandwidth.

It is well known that the acousto-optic coupling factor, which determines the efficiency of Bragg reflection by an acoustic wave, varies with crystal orientation in non-isotropic materials such as lithium niobate. The crystal orientation for maximum acousto-optic coupling does not in general correspond to that for maximum piezo-electric efficiency. Thus in order to obtain maximum overall efficiency, i.e. maximum Bragg-deflected light for each component of the signal fed to the interdigital transducer, it is desirable to independently maximise the piezo-electric and acousto-optic coupling factors of the Bragg cell without introducing any attenuation of the acoustic or optical beams. We have found that such an optimisation in performance can be achieved in a hybrid Bragg cell for a spectrum analyser in accordance with the invention, comprising an interdigital transducer fixed to a first crystal cut so as to substantially maximise piezo-electric coupling between said transducer and said first crystal, and a second crystal bonded by a this metal bonding layer to a face of said first crystal and cut so as to substantially maximise acousto-optic coupling between an acoustic beam from said transducer and an optical beam directed through said second crystal in use of the anlyser. By a "thin" metal bonding layer is meant a metal bonding layer having a thickness not greater than one $\mu$m. Preferably said bonding layer is less than one $\mu$m in thickness. We have found that gold is a particularly suitable metal for bonding lithium niobate crystals in a hybrid Bragg cell, although indium is also suitable.

The invention will be understood in more detail on consideration of FIGS. 1 to 6 of the accompanying drawings, of which:

Figure 1:
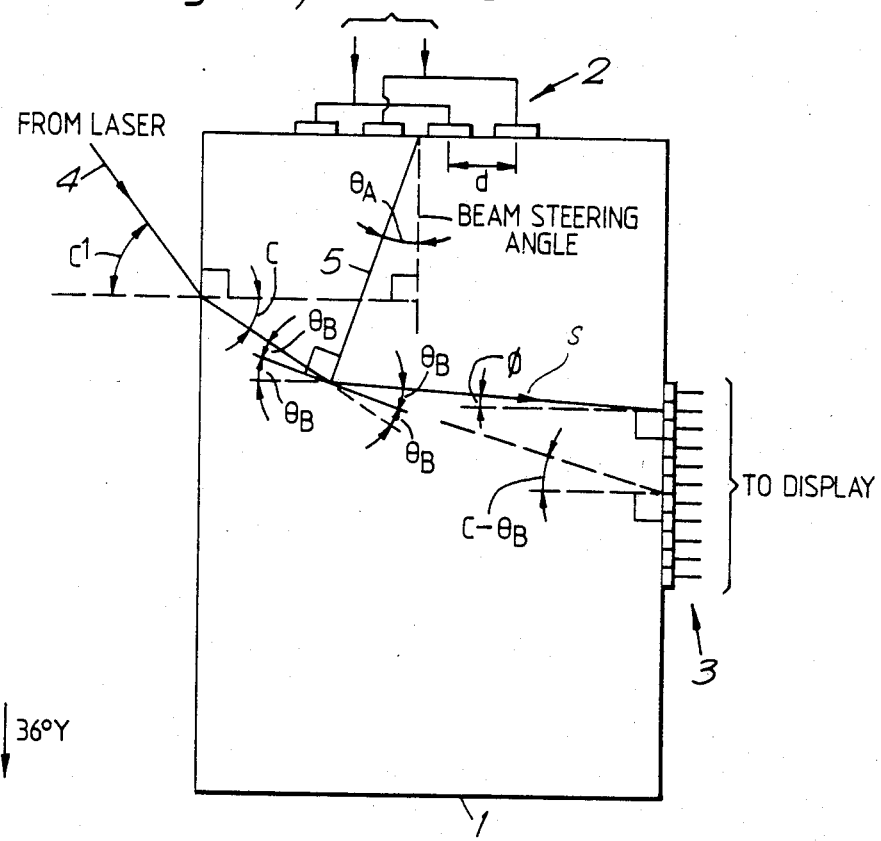
FIG. 1 is a schematic plan view showing by way of example one particular monolithic Bragg cell in accordance with the invention.

Referring first to FIG. 1, which shows the geometrical conditions for Bragg reflection, the Bragg cell shown comprises a polished 36° Y cut cuboidal lithium niobate block 1 with an interdigital transducer 2 mounted on one face and an array 3 of photoelectric detectors of known type mounted on an adjacent face. In use a microwave or other signal to be analysed is fed to the transducer 2, which generates a beam 5 of bulk elastic waves, having the same frequency spectrum as the microwave signal in lithium niobate block 1. An optical beam 4 from a laser (not shown) is refracted at an internal angle of entry C into the face of block 1 opposite that on which the photoelectric detector array is mounted and is Bragg-reflected by acoustic beam 5, undergoing a deflection of $2\theta_B$. Each deflected beam (S) is detected by detector array 3 and displayed after being amplified. $\theta_B$, the Bragg angle, is given by the formula $$\theta_B = \sin^{-1} \frac{f\lambda_o}{2nv_a}$$

where:

$\lambda_o$ is the optical wavelength in free space of beam 4,
n is the refractive index of lithium niobate,
f is the frequency of the acoustic beam, and
$v_a$ is the phase velocity of the acoustic beam.

Figure 2:
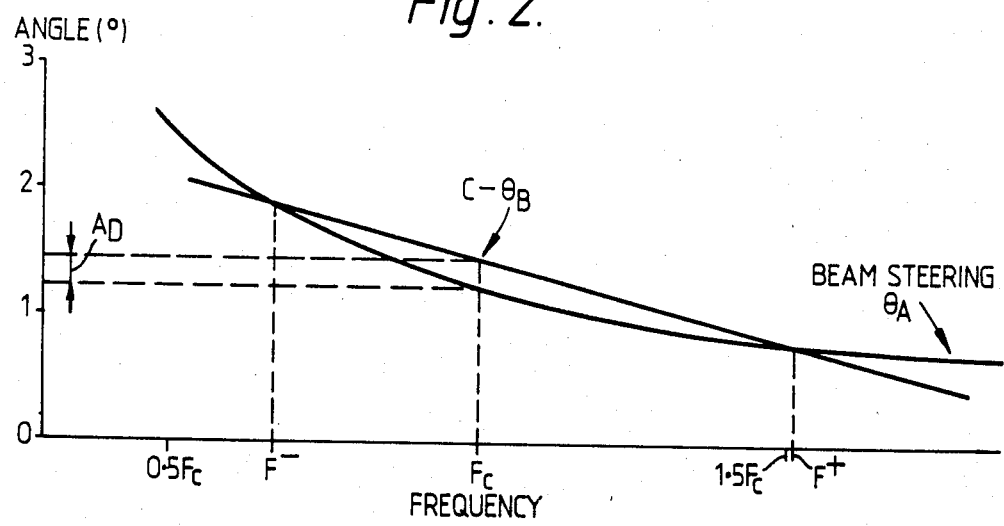
FIG. 2 is a plot showing the variation with acoustic frequency of the Bragg and beam-steering angles of the Bragg cell of FIG. 1.

Thus for a given orientation of the acoustic beam (defined by the beam steering angle $\theta_A$) the angle C-$\theta_B$ and hence the linear deflection of beam 4 along array 3 will vary linearly with frequency when $\theta_B$ is small, as shown in FIG. 2.

The beam steering angle $\theta_a$ for longitudinal bulk acoustic waves is given by the formula $$\theta_a = \sin^{-1}\frac{v_a}{fd}$$

where d is the period (as shown in FIG. 1) of the interdigital transducer. It may be seen (FIG. 2) that the beam steering angle will vary in a non-linear manner with frequency over a range of about 3:1 in frequency. From FIG. 1 it may be seen that the angle, to the normal, of optical beam 4 is given by $$\phi = C - 2\theta_B$$

and that $$C = \theta_B + \theta_A.$$

Thus Bragg reflection will only occur when $C - \theta_B = \theta_A$. It may be seen from FIG. 2 that this condition is satisfied at only two frequencies $F^+$ and $F^-$, assuming that the acoustic beam has zero width. These frequencies may be varied by adjusting the angle of entry and or the finger spacing d, since $$F^{\pm} = \frac{\left[C \pm \left(C^2 - \frac{2\lambda_o}{nd}\right)^{\frac{1}{2}}\right]_{nv_a}}{\lambda_o}$$

The bandwidth of the Bragg cell may be arranged to extend somewhat outside the range $F^-$ to $F^+$ by arranging $F^+$ and $F^-$ to be sufficiently close together so that the maximum angular discrepancy $A_D$ between $C - \theta_B$ and $\theta_A$ is less than the divergence of the acoustic beam. This discrepancy is a maximum at the centre frequency $F_c$ of the cell, and is determined by setting $$\frac{\delta}{\delta f}(\theta_A - \theta_B) = 0$$

to give $$F_c = v_a\sqrt{\frac{2n}{d\lambda_o}}$$

It will be seen that the required width of the acoustic beam in Bragg cells in accordance with the invention may be determined particularly easily. Furthermore the design of interdigital transducers to produce acoustic beams of specified divergence is a relatively simple matter to those skilled in the art, since the divergence increases as the number of finger pairs in the transducer is decreased.

Figure 3:
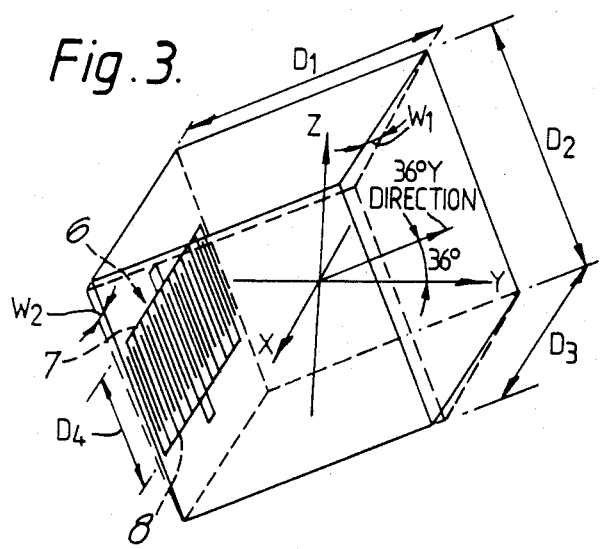
FIG. 3 is a sketch perspective view illustrating an interdigital transducer mounted on a 36° Y cut lithium niobate crystal for use in a spectrum analyser in accordance with the invention.

FIG. 3 shows a generally cuboidal 36° Y cut lithium niobate block with an interdigital transducer formed on one face. The transducer was made from 0.1 μm thick aluminium deposited by a standard photolithographic process. The transducer is shown greatly enlarged relative to the size of the block for the sake of clarity, and comprises two sets 7 and 8 of twelve connected interdigitating fingers. The acoustic aperture D4 was 0.3 mm and the peroid of the transducer was 303 μm. The dimensions $D_1$, $D_2$ and $D_3$ of the block were respectively 5, 2 and 8 mm.

Figure 6:
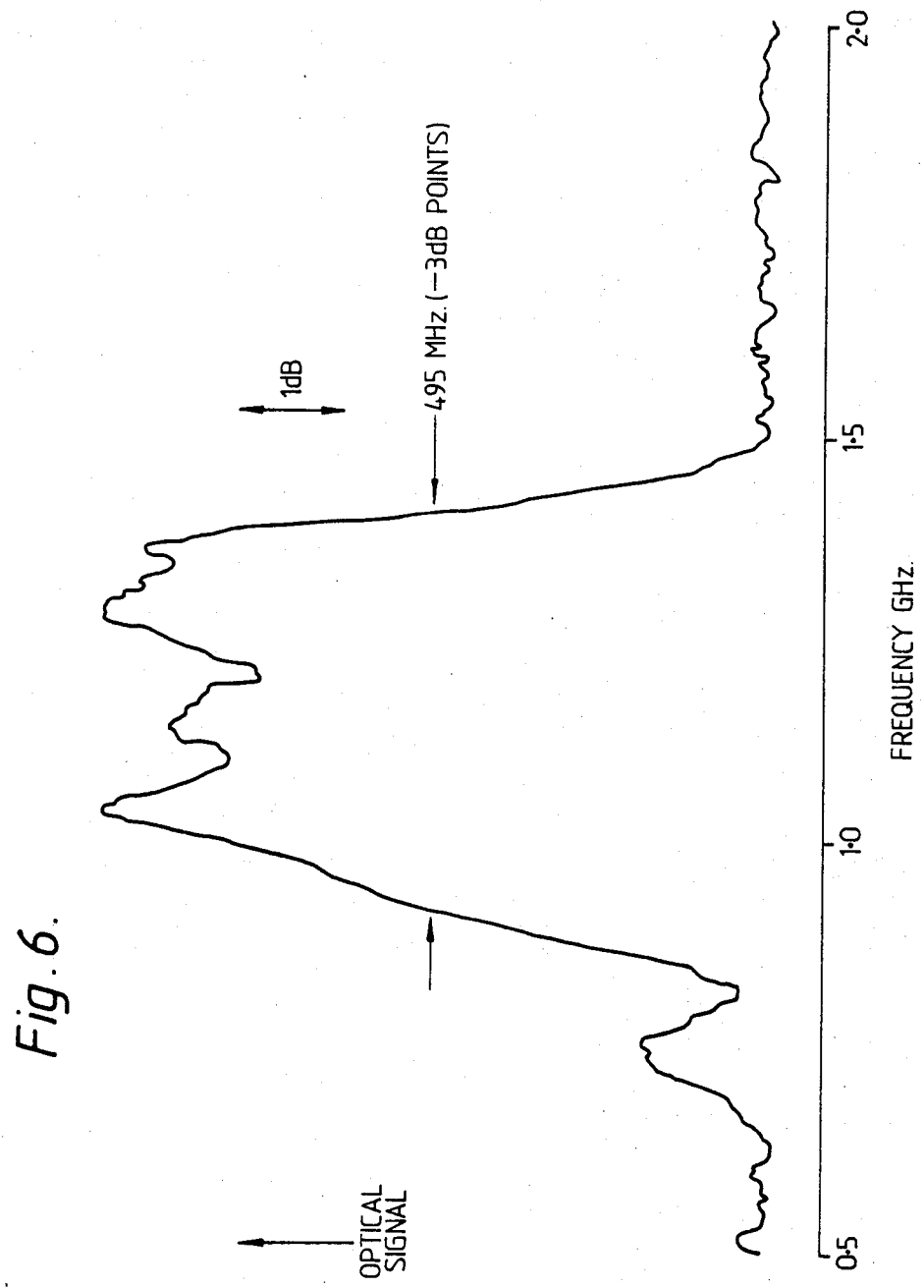
FIG. 6 is a plot showing a typical frequency response of a monolithic lithium niobate Bragg cell in accordance with the invention.

As can be seen by reference to the illustrated X, Y and Z axes, a 36° Y cut block was used, acoustic and optical wedges W1 and W2 of approximately 1° being cut from faces 36° Y and X respectively. These suppress unwanted acoustic and optical reflections. The cell was then mounted in gold plated "dural" box and connected electrically by gold wire bonding one set of fingers to a 50Ω stripline, and the other side to earth. A laser beam of wavelength 633 nM was shone into an X face of the block and the optical frequency response (i.e. the relative amount of Bragg - deflected light as a function of the frequency of signal fed to the transducer) plotted at the external angle of entry $C^1$ of the laser beam into the block. The results are shown in FIG. 6 and the main parameters are as follows:

centre frequency = 1150 MHz

3dB bandwidth = 495 MHz (43%)

ripple = 24% (-1 dB). In the light of these results we recommend a 12 finger pair transducer having a period of 380 μm in order to obtain a 500 MHz bandwidth at a centre frequency of 1 GHz.

Figure 4:
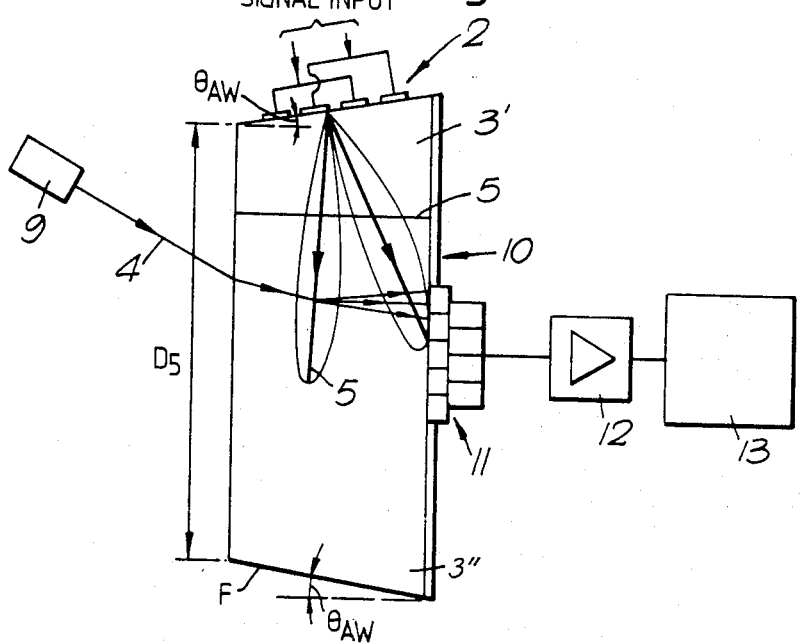
FIG. 4 is a schematic plan view showing by way of example one particular spectrum analyser in accordance with the invention.
Figure 5:
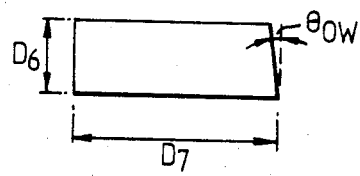
FIG. 5 is an elevation showing the face of the Bragg cell of FIG. 4 opposite the interdigital transducer.

FIGS. 4 and 5 show a preferred embodiment of the invention, FIG. 5 being on elevation of face F. The spectrum analyser shown comprises a laser 9, a Bragg cell 10 on which is mounted a photoelectric detector array 11 and an interdigital transducer 2. The Bragg cell is provided with acoustic wedges $\theta_{AW}$ and an optical wedge $\theta_{OW}$ of approximately 1 degree. Optical beam 4 is Bragg deflected by acoustic beam 5 from the transducer and split up according to the spectrum of the microwave signal fed to the transducer. Signals detected by the array 11 are amplified by amplifier 12 and displayed on display 13. The dimensions $D_5$, $D_6$ and $D_7$ are suitably 10, 5 and 4 mm respectively. The period and aperture of transducer 2 are suitably 380 and 4.6 mm respectively, to give a centre frequency of approximately 1 GHz and a bandwidth of approximately 500 MHz.

Bragg cell 10 differs from that shown in FIG. 3 in that it comprises two accurately machined blocks 3' and 3" of lithium niobate bonded together by 0.3 μm thick gold bonding layer 15. Block 3' is 126° Y cut (transducer 2' being formed on the 126° Y face), this being the cut for lithium niobate which optimises the piezo-electric coupling factor for quasi-longitudinal waves, and block 3" is X cut, so as to maximimise the acousto-optic coupling with optical beam 4.

In some situations indium may be used instead of gold for the bonding layer, even though this metal has a much higher acoustic attenuation than indium.

We claim:

1. A bulk wave Bragg cell comprising:
   (a) a block of crystalline piezoelectric lithium niobate provided with a cut face and
   (b) an interdigital transducer mounted on said cut face for generating a beam of quasi-longitudinal elastic waves in said block of crystalline lithium niobate, wherein said face is cut substantially in the plane selected from the group consisting of 36° Y and 126° Y relative to the crystal orientation of said lithium niobate to thereby maximize the ratio of quasi-longitudinal:-quasi-shear wave piezoelectric coupling of said interdigital transducer with said lithium niobate.

2. A bulk wave Bragg cell as claimed in claim 1, wherein said cut face is cut substantially in the 36° Y plane.

3. A bulk wave Bragg cell as claimed in claim 1, wherein said cut face is cut substantially in the 126° Y plane and said lithium niobate block is provided with a second cut face opposite said 126° Y cut face at which second cut face said lithium niobate block is bonded by a metal bonding layer to a face of a second block of crystalline lithium niobate, wherein said second block is substantially X-cut relative to its crystal orientation to thereby maximize the acousto-optic coupling factor of said elastic waves within said second block.

4. A bulk wave Bragg cell as claimed in claim 1, further comprising:
(a) laser means for injecting a light beam into said block at a predetermined internal angle of entry, as measured with respect to the X-direction of said crystalline lithium niobate in the plane defined by said X-direction and the normal of said cut face,
(b) means for applying a microwave signal to said interdigital transducer to generate said beam of said quasi-longitudinal elastic waves at a predetermined beam steering angle with respect to said normal of said cut face and thereby to deflect said light beam by a mean deflection angle, and
(c) distributed light detector means for detecting the deflected light beam,
wherein said interdigital transducer comprises a plurality of interdigitating fingers, the number of said interdigitating fingers being such that the divergence of said beam of quasi-longitudinal elastic waves is substantially equal to the difference between said angle of entry of said light beam and an angle equal to one half said mean deflection angle.

5. A Bragg cell as claimed in claim 4, wherein said metal bonding layer is comprised of indium.

6. A Bragg cell as claimed in claim 4, wherein said metal bonding layer is comprised of gold.

7. A Bragg cell as claimed in claim 4, wherein said metal bonding layer is less than 1 $\mu$m thick.

* * * * *